US010236422B1

United States Patent
Nordsell et al.

(10) Patent No.: US 10,236,422 B1
(45) Date of Patent: Mar. 19, 2019

(54) PHOSPHORS WITH NARROW GREEN EMISSION

(71) Applicant: EIE MATERIALS, INC., Lexington, KY (US)

(72) Inventors: Robert Nordsell, Lexington, KY (US); Evan Thomas, Lexington, KY (US); Yong Bok Go, Lexington, KY (US); Kristen Baroudi, Lexington, KY (US); Jonathan Melman, Lexington, KY (US); Yuming Xie, Sugar Land, TX (US)

(73) Assignee: EIE MATERIALS, INC., Lexington, KY (US)

( * ) Notice: Subject to any disclaimer, the term of this patent is extended or adjusted under 35 U.S.C. 154(b) by 0 days.

(21) Appl. No.: 15/990,378

(22) Filed: May 25, 2018

Related U.S. Application Data

(60) Provisional application No. 62/673,044, filed on May 17, 2018.

(51) Int. Cl.
*H01L 33/50* (2010.01)
*C09K 11/77* (2006.01)
*H01L 33/56* (2010.01)

(52) U.S. Cl.
CPC ........ *H01L 33/502* (2013.01); *C09K 11/7734* (2013.01); *H01L 33/507* (2013.01); *H01L 33/56* (2013.01); *H01L 2933/005* (2013.01); *H01L 2933/0041* (2013.01)

(58) Field of Classification Search
CPC ............... H01L 33/502; H01L 33/507; H01L 2933/0041; H01L 2933/005; H01L 33/56; C09K 11/7734
See application file for complete search history.

(56) References Cited

U.S. PATENT DOCUMENTS

| | | |
|---|---|---|
| 3,639,254 A | 2/1972 | Peters |
| 3,801,702 A | 4/1974 | Donohue |
| 4,441,046 A | 4/1984 | James |
| 5,747,929 A | 5/1998 | Kato et al. |
| 6,417,019 B1 | 7/2002 | Mueller et al. |
| 6,597,108 B2 | 7/2003 | Yano et al. |
| 6,614,173 B2 | 9/2003 | Yano et al. |
| 6,627,251 B2 | 9/2003 | Yano et al. |

(Continued)

OTHER PUBLICATIONS

Ruijin Yu et al., "Luminescence properties of stoichionmetric EuM2S4 (M=Ga, Al) conversion phosphors for white LED applications", Phys. Status Solidi A, May 31, 2012, pp. 1-6, DOI 10.1002/pssa. 201228348, Wiley Online Library.

(Continued)

*Primary Examiner* — Kyoung Lee
(74) *Attorney, Agent, or Firm* — Innovation Counsel LLP

(57) ABSTRACT

Green emitting phosphors have the empirical composition $RE_{1-w}A_wM_xE_y$, where RE may be one or more Rare Earth elements (for example, Eu or Gd), A may be one or more elements selected from the group Mg, Ca, Sr, or Ba, M may be one or more elements selected from the group Al, Ga, B, In, Sc, Lu or Y, E may be one or more elements selected from the group S, Se, O, or Te, w is greater than or equal to zero, or greater than or equal to 0.01, or greater than or equal to 0.05, and less than or equal to about 0.8, $2 \leq x \leq 4$, and $4 \leq y \leq 7$.

17 Claims, 15 Drawing Sheets

(56) References Cited

U.S. PATENT DOCUMENTS

| | | | |
|---|---|---|---|
| 6,773,629 B2 | 8/2004 | Le Mercier et al. | |
| 6,926,848 B2 | 8/2005 | Le Mercier et al. | |
| 7,005,198 B2 | 2/2006 | Yano et al. | |
| 7,018,565 B2 | 3/2006 | Tian et al. | |
| 7,125,501 B2 | 10/2006 | Tian et al. | |
| 7,368,179 B2 | 5/2008 | Tian et al. | |
| 7,427,366 B2 | 9/2008 | Tian et al. | |
| 7,453,195 B2 | 11/2008 | Radkov | |
| 7,497,973 B2 | 3/2009 | Radkov et al. | |
| 7,651,631 B2 | 1/2010 | Igarashi et al. | |
| 7,768,189 B2 | 8/2010 | Radkov | |
| 7,816,862 B2 | 10/2010 | Noguchi et al. | |
| 8,921,875 B2 | 12/2014 | Letoquin et al. | |
| 9,219,201 B1 | 12/2015 | Todorov et al. | |
| 9,243,777 B2 | 1/2016 | Donofrio et al. | |
| 9,496,464 B2 | 11/2016 | Yao et al. | |
| 9,530,944 B2 | 12/2016 | Jacobson et al. | |
| 9,607,821 B2 | 3/2017 | Levin et al. | |
| 2002/0155317 A1 | 10/2002 | Yano et al. | |
| 2003/0042845 A1 | 3/2003 | Pires et al. | |
| 2006/0158090 A1* | 7/2006 | Wang | C09K 11/7734 313/485 |
| 2007/0284563 A1 | 12/2007 | Lee et al. | |
| 2008/0296533 A1 | 12/2008 | Stiles et al. | |
| 2013/0114242 A1 | 5/2013 | Pickard et al. | |
| 2013/0313516 A1 | 11/2013 | David et al. | |
| 2014/0077689 A1 | 3/2014 | Thompson et al. | |
| 2014/0307417 A1 | 10/2014 | Yamakawa et al. | |
| 2014/0321099 A1 | 10/2014 | Kaide et al. | |
| 2016/0009990 A1 | 1/2016 | Yoo et al. | |
| 2016/0223146 A1 | 8/2016 | Vick et al. | |

OTHER PUBLICATIONS

K.T. Le Thi, et al., "Investigation of the MS-A12S3 systems (M=Ca, Sr, Ba) and luminescence properties of europium-doped thioaluminates", Materials Science and Engineering, B14 (1992) pp. 393-397.

P.C. Donohue, et al., "The Synthesis and Photoluminescence of MiiM2iii(S,Se)4", J. Electrochem. Soc. 1974, vol. 121, Issue 1, pp. 137-142.

A.G. Paulusz, "Efficient Mn(IV) Emission in Fluorine Coordination", J. Electrochem. Soc.: Solid-State Science and Technology, Jul. 1973, pp. 942-947.

Zhang, et al., "Robust and Stable Narrow-Band Green Emitter: An Option for Advanced Wide-Color-Gamut Backlight Display", CM Chemistry of Materials, Chem. Mater. 2016, 28, pp. 8493-8497.

International Search Report, PCT/US2018/020914, dated May 17, 2018, 1 page.

* cited by examiner

PHOSPHORS WITH NARROW GREEN EMISSION

CROSS REFERENCE TO RELATED APPLICATIONS

This application claims benefit of priority to U.S. Provisional Patent Application No. 62/673,044 titled "Phosphors With Narrow Green Emission" and filed May 17, 2018, which is incorporated herein by reference in its entirety.

This invention was made with federal government support from the National Science Foundation under award number 1534771. The federal government has certain rights in the invention. This invention was also made with an award from the Kentucky Cabinet for Economic Development, Office of Entrepreneurship, under Grant Agreement KSTC-184-512-17-247 with the Kentucky Science and Technology Corporation.

FIELD OF THE INVENTION

The invention relates generally to phosphors having narrow green emission.

BACKGROUND

Alkaline earth thiogallate and alkaline earth thioaluminate phosphors activated with europium are known in the art for both electroluminescent systems and phosphor converted LED systems. These materials can readily absorb the emission from blue, violet, or near UV emitting light sources such as the commonplace InGaN light emitting diodes. These typically green phosphor materials can be used independently to generate a green light, or they can be combined with other phosphor materials to generate white or other colored light. Similarly, these green phosphor materials may be combined, for example, with a blue or other LED and a red phosphor in order to generate the backlighting unit for a display, such as a mobile phone, tablet, laptop, monitor, or television.

In general lighting, it is often desirable to have a broad emission spectrum to improve the color rendering index ($R_a$) or other quality of light metrics, such as CQS or TM-30-15. However, sometimes in lighting it is desirable to provide extra light in certain wavelength regions in order to accentuate certain features; for instance, grocery store display cases for beef may include extra light in the red region of the spectrum, similarly, spinach or green peppers may appear more pleasing when the lighting provides extra light in certain green wavelengths.

In display backlighting, it is more desirable to have a narrow emission wavelength so that the color (a) appears more saturated and widens the green vertex of the color gamut, and (b) sustains fewer losses when passing through the green filter of a typical LCD filter system, because the majority of its intensity is well aligned with the highest transmissivity of the filter.

SUMMARY

Phosphors of the present invention address the challenge of helping to preferentially saturate certain green regions of the emission spectrum for lighting applications and improve the green gamut point of a display backlight unit by providing a phosphor composition with a relatively narrow green emission spectrum.

In one aspect of the invention, green emitting phosphors have the empirical composition $RE_{1-w}A_wM_xE_y$, where RE may be one or more Rare Earth elements (for example, Eu or Gd), A may be one or more elements selected from the group Mg, Ca, Sr, or Ba, M may be one or more elements selected from the group Al, Ga, B, In, Sc, Lu or Y, E may be one or more elements selected from the group S, Se, O, or Te, w is greater than or equal to zero, or greater than or equal to 0.01, or greater than or equal to 0.05, w is less than or equal to about 0.8, $2 \leq x \leq 4$, and $4 \leq y \leq 7$. In some variations, w is greater than or equal to about 0.30 and less than or equal to about 0.66.

In another aspect of the invention, a phosphor converted LED comprises such a green emitting phosphor.

These and other embodiments, features and advantages of the present invention will become more apparent to those skilled in the art when taken with reference to the following more detailed description of the invention in conjunction with the accompanying drawings that are first briefly described.

DETAILED DESCRIPTION

Figure 1:
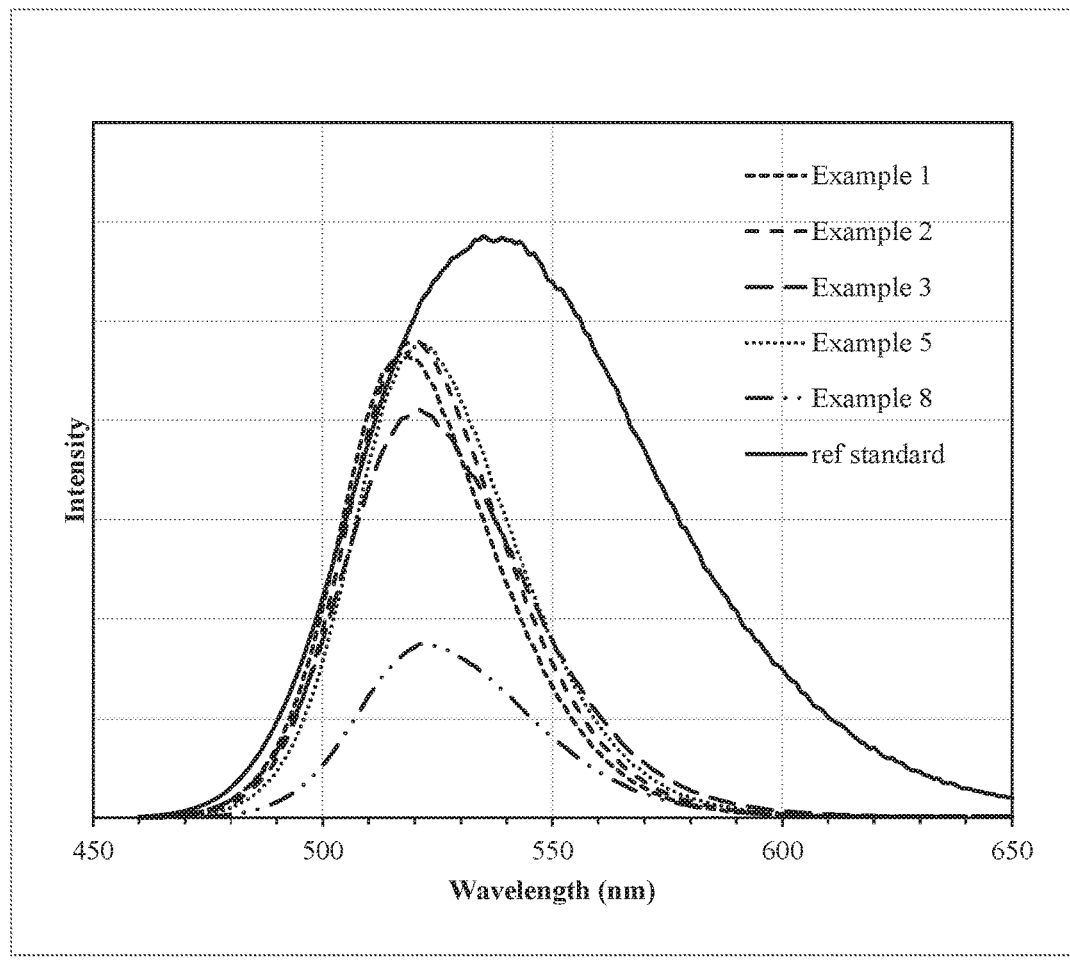
FIG. 1 shows emission spectra for phosphor examples 1, 2, 3, 5 and 8 and for an internal reference standard.

The following detailed description should be read with reference to the drawings, which depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. As used in this specification and the appended claims, the singular forms "a," "an," and "the" include plural referents unless the context clearly indicates otherwise.

Phosphors of the present invention emit green light over a relatively narrow range of emission wavelengths in response to excitation with, for example, ultraviolet, violet, blue, or short wavelength green light. Their narrow emission may appear more saturated and widen the green vertex of the color gamut compared to commercially available green phosphors.

Phosphors of the present invention have the empirical composition $RE_{1-w}A_wM_xE_y$, where RE may be one or more Rare Earth elements (for example, Eu or Gd), A may be one or more elements selected from the group Mg, Ca, Sr, or Ba, M may be one or more elements selected from the group Al, Ga, B, In, Sc, Lu or Y, E may be one or more elements selected from the group S, Se, O, or Te, w is greater than or equal to zero, or greater than or equal to 0.01, or greater than or equal to 0.05, and less than or equal to about 0.8, $2 \leq x \leq 4$, and $4 \leq y \leq 7$. Some minor compositional substitutions may also occur from the use of reaction promoters including but not limited to $EuF_3$, $AlCl_3$ or $I_2$. The phosphors may have the same basic pseudoorthorhombic crystal structure as $EuGa_2S_4$. The phosphors may comprise a mixture of that pseudoorthorhombic crystal phase and one or more binary chalcogenide crystals phases such as for example an $M_2E_3$ (e.g., $Ga_2S_3$) crystal phase or an ME (e.g., GaS) crystal phase.

Phosphors of the present invention may show an improvement over known alkaline earth thiogallate phosphors by providing a narrower emission spectrum than is provided by state of the art thiogallate phosphors. Phosphors of the present invention may show an improvement in brightness over $EuM_2E_4$ compositions such as, for example, $EuAl_2S_4$, $EuAl_2Se_4$, and $EuGa_2S_4$ disclosed by Thi et al. *Materials Science & Engineering B*14 (1992), No 4, pp. 393-397, Donohue U.S. Pat. No. 3,801,702 (issued Apr. 2, 1974), and Donohue and Hanlon, *Journal of the Electrochemical Society: Solid-State Science and Technology* (1974), Vol. 121, No. 1, pp. 137-142. Phosphors of the present invention do not appear to show a significant reduction, if any at all, in luminescence efficiency even when the europium percentage far exceeds the range noted by van Haecke as the maximum, and may include rare earth elements (e.g., europium) at concentrations beyond ranges normally considered as doping.

Phosphors of the present invention may be less hygroscopic and therefore more stable in air than prior art thiogallate and related phosphors.

Phosphors of the present invention may be tuned through a wavelength range based upon application requirements by varying the A, M and E components of the composition.

A number of fluxes/reaction promoters have been investigated, such as for example $I_2$, $AlF_3$, $AlCl_3$, $AlBr_3$, $GaCl_3$, $GaBr_3$, $BaF_2$, LiCl, CsCl, $EuF_3$, $EuCl_3$, $EuI_2$, and $Na_2S$. Use of promoters with cations other than those in the targeted final product may in some cases result in the formation of alternative phases, which may not meet the desired properties of the invention.

Phosphors of the present invention may be coated to improve reliability or handling of the materials.

The phosphors of the present invention may be optically coupled with an excitation source in any conventional manner. One of the more common methods is to combine phosphors, such as the green phosphors disclosed here, with a red phosphor and optional blue and/or yellow phosphors. The phosphors may be combined together and then added to an encapsulant, such as silicone, epoxy, or some other polymer, or the phosphors may be combined during their addition to the encapsulant. The phosphor loaded encapsulant may then be placed in the optical path of an excitation source. One common method is to deposit the slurry of phosphor or phosphors into an LED (light emitting diode) package which contains an LED die. The slurry is then cured forming an encapsulated LED package. Other methods include forming the encapsulant into a shape or coating the encapsulant onto a substrate which may already be in a particular shape, or may be subsequently formed into a particular shape. Additionally, the phosphor containing encapsulant may be disposed on or near (e.g., coated on) the in-coupling region of a light guide, or on the out-coupling region of a light guide, such as a light guide intended for use in a display. Alternatively, the phosphor composition may be deposited as a thin film on the LED die or on another substrate and subsequently optically coupled to the light source. The combination of an excitation source and the phosphors of the present invention may be used in general lighting, niche lighting applications, display backlighting, or other lighting applications.

Applicant has prepared and characterized a number of example phosphor samples having the empirical composition $RE_{1-w}A_wM_xE_y$ described above. Preparation and characterization of these examples is described below and summarized in tables below. For some samples one or more crystal phases observed by powder x-ray diffraction are reported in addition to the empirical composition. Emission spectra were measured using a Fluorolog-3 spectrofluorometer with xenon lamp or an Ocean Optics spectrometer used in conjunction with an external blue or violet LED excitation source. Excitation spectra were measured using a Fluorolog-3 spectrofluorometer with xenon lamp. Powder x-ray diffraction spectra were measured using a Rigaku Mini-Flex600.

Example $Eu_{1-w}Ca_wM_xS_y$ Phosphors

Example 1. $Eu_{0.80}Ca_{0.20}Al_{3.45}Ga_{0.63}S_{7.11}$ (may be a mixture of $Eu_{0.80}Ca_{0.20}Al_{1.69}Ga_{0.31}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 40 mg of Al powder, 15 mg CaS, and 75 mg $Ga_2S_3$ were hand-ground in a mortar with a pestle. The mixed powder was fired in an alumina cup at 950° C. for 1 hour under $H_2S$ atmosphere.

Example 2. $Eu_{0.66}Ca_{0.34}Al_{2.86}Ga_{0.56}S_{6.13}$ (may be a mixture of $Eu_{0.66}Ca_{0.34}Al_{1.67}Ga_{0.33}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 40 mg of Al powder, 30 mg CaS, and 80 mg $Ga_2S_3$ were hand-ground in a mortar with a pestle. The mixed powder was fired in an alumina cup at 950° C. for 1 hour under $H_2S$ atmosphere.

Example 3. $Eu_{0.59}Ca_{0.41}Al_{2.71}Ga_{0.72}S_{6.13}$ (may be a mixture of $Eu_{0.59}Ca_{0.41}Al_{1.58}Ga_{0.42}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 45 mg of Al powder, 40 mg CaS, and 115 mg $Ga_2S_3$ were hand-ground in a mortar with a pestle. The mixed powder was fired in an alumina cup at 950° C. for 1 hour under $H_2S$ atmosphere.

Example 4. $Eu_{0.58}Ca_{0.42}Al_{2.57}Ga_{0.58}S_{5.73}$ (may be a mixture of $Eu_{0.58}Ca_{0.42}Al_{1.63}Ga_{0.37}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 42 mg of Al powder, 42 mg CaS, and 95 mg $Ga_2S_3$ were hand-ground in a mortar with a pestle. The mixed powder was fired in an alumina cup at 960° C. for 1 hour under $H_2S$ atmosphere.

Example 5. $Eu_{0.66}Ca_{0.34}Al_{2.86}Ga_{0.62}S_{6.23}$ (may be a mixture of $Eu_{0.66}Ca_{0.34}Al_{1.64}Ga_{0.36}S_4$ and $(Al,Ga)_2S_3$): $Eu_2O_3$ (1.084 g, 3.08 mol) and powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 40 mg of Al powder, 30 mg CaS, and 90 mg $Ga_2S_3$ were hand-ground in a mortar with a pestle. The mixed powder was fired in an alumina cup at 950° C. for 1 hour under $H_2S$ atmosphere.

Example 6. $Eu_{0.66}Ca_{0.34}Al_{2.26}Ga_{0.49}S_{5.11}$ (may be a mixture of $Eu_{0.66}Ca_{0.34}Al_{1.64}Ga_{0.36}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 3 g of $EuAl_{2.5}S_{4.75}$ precursor, 0.2 g of Al powder, 0.3 g CaS, and 0.7 g $Ga_2S_3$ were hand-ground in a mortar with a pestle. The mixed powder was fired in an alumina cup at 960° C. for 2 hours under $H_2S$ atmosphere.

Example 7. $Eu_{0.55}Ca_{0.45}Al_{2.31}Ga_{0.54}S_{5.29}$ (may be a mixture of $Eu_{0.55}Ca_{0.45}Al_{1.62}Ga_{0.38}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 200 mg of $EuAl_{2.5}S_{4.75}$ precursor, 25 mg of Al powder, 32 mg CaS, and 63 mg $Ga_2S_3$ were hand-ground in a mortar with a pestle. The mixed powder was fired in an alumina cup at 970° C. for 1 hour under $H_2S$ atmosphere.

Example 8. $Eu_{0.49}Ca_{0.51}Al_{2.08}Ga_{0.51}S_{4.88}$ (may be a mixture of $Eu_{0.49}Ca_{0.51}Al_{1.61}Ga_{0.39}S_4$ and $(Al,Ga)_2S_3$): $Eu_2O_3$ (1.084 g, 3.08 mol) and Al powder (0.415 g, 15.41 mol) were mixed using a speed mixer 3 times for 45 seconds at 2000 rpm. The mixed powder was fired at 900° C. for 1 hour under $H_2S$ atmosphere in an alumina boat. The fired precursor cake was hand ground in the glovebox to break it into a powder. 300 mg of $EuAl_{2.5}S_{4.75}$ precursor, 37.5 mg of Al powder, 60 mg CaS, and 97.5 mg $Ga_2S_3$ were hand-ground in a mortar with a pestle. The mixed powder was fired in an alumina cup at 950° C. for 1 hour under $H_2S$ atmosphere.

Figure 2:
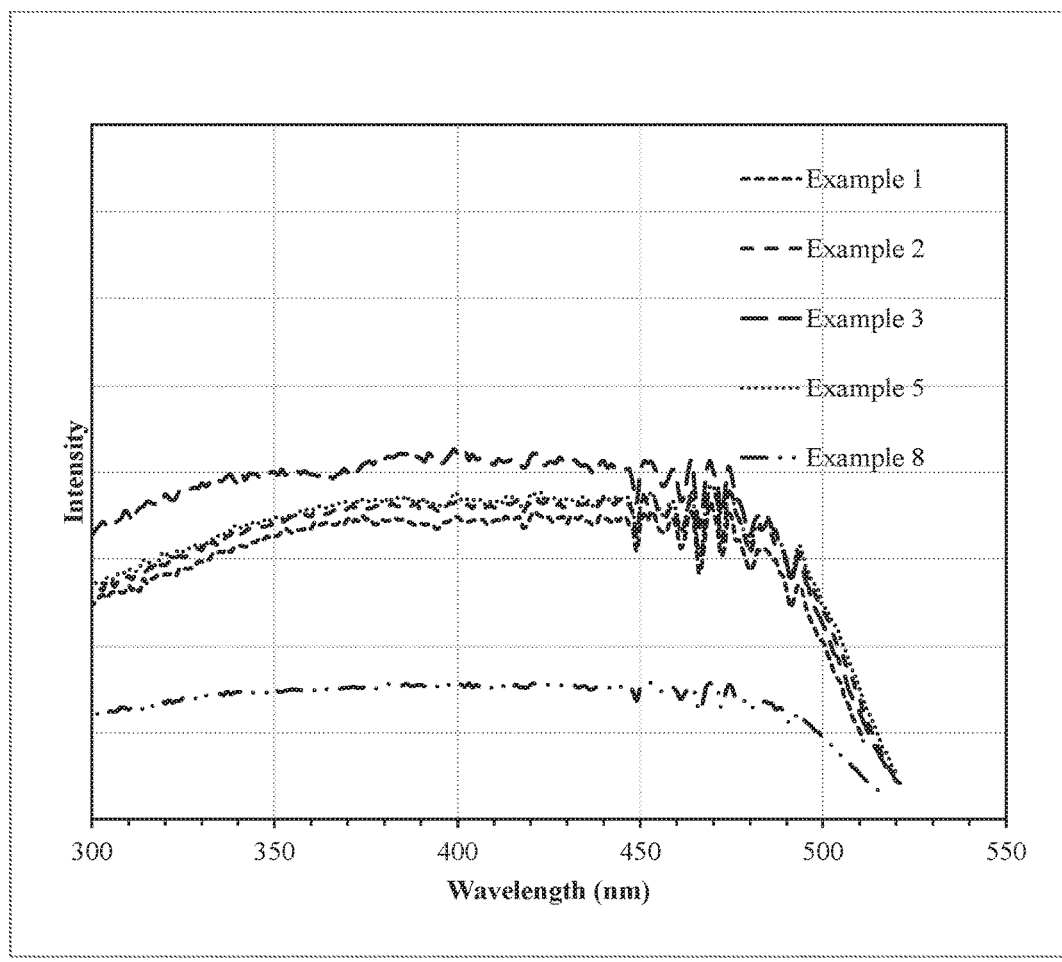
FIG. 2 shows excitation spectra for phosphor examples 1, 2, 3, 5 and 8.

FIG. 1 shows emission spectra for examples 1, 2, 3, 5 and 8 and for an internal reference standard, with excitation at 450 nm. FIG. 2 shows excitation spectra for examples 1, 2, 3, 5 and 8, with emission monitored at the emission maximum.

Example 9. $Eu_{0.5}Ca_{0.5}Al_{2.25}Ga_{0.75}S_{5.5}$ (may be a mixture of $Eu_{0.5}Ca_{0.5}Al_{1.5}Ga_{0.5}S_4$ and $(Al,Ga)_2S_3$): Pre-made $EuAl_2S_4$ was combined with CaS, Al, and $Ga_2S_3$ in the desired stoichiometry. The mixture was heated under flowing $H_2S$.

Example 10. $Eu_{0.5}Ca_{0.5}Al_{2.25}Ga_{0.75}S_{5.5}$ (may be a mixture of $Eu_{0.5}Ca_{0.5}Al_{1.5}Ga_{0.5}S_4$ and $(Al,Ga)_2S_3$): EuS was combined with CaS, Al, and $Ga_2S_3$ in the desired stoichiometry. The mixture was heated under flowing $H_2S$.

Example 11. $Eu_{0.085}Ca_{0.915}Al_{2.55}Ga_{0.45}S_{5.5}$ (may be a mixture of $Eu_{0.085}Ca_{0.915}Al_{1.7}Ga_{0.3}S_4$ and $(Al,Ga)_2S_3$): EuS was combined with CaS, Al, and $Ga_2S_3$ in the desired stoichiometry. The mixture was heated under flowing $H_2S$.

Example 12. $Eu_{0.5}Ca_{0.5}Al_{2.25}Ga_{0.75}S_{5.5}$ (may be a mixture of $Eu_{0.5}Ca_{0.5}Al_{1.5}Ga_{0.5}S_4$ and $(Al,Ga)_2S_3$): Pre-made $EuAl_2S_4$ was combined with CaS, Al, and $Ga_2S_3$ in the desired stoichiometry, plus 10% CsCl was added as flux. The mixture was heated under flowing $H_2S$.

Example 13. $Eu_{0.7}Ca_{0.3}Al_{2.7}S_{5.05}$ (may be a mixture of $Eu_{0.5}Ca_{0.5}Al_2S_4$ and $Al_2S_3$): 0.542 g Eu, 0.110 g CaS, 1.033 g $Al_2S_3$, 0.114 g S and 0.090 g $AlCl_3$ were ground together in a mortar and pestle in an argon filled glovebox. The mixture of reactants was divided equally between four sealed fused silica tubes. The tubes were heated together in a box furnace with the following heating profile: ramp from room temperature to 400° C. over 120 min, dwell at 400° C. for 60 min, ramp from 400° C. to 900° C. over 150 min, dwell at 900° C. for 360 min, then ramp to room temperature over 1080 min.

Example 14. $Eu_{0.7}Ca_{0.3}Al_{2.4}Ga_{0.3}S_{5.05}$ (may be a mixture of $Eu_{0.7}Ca_{0.3}Al_{1.78}Ga_{0.22}S_4$ and $(Al,Ga)_2S_3$): 0.523 g Eu, 0.106 g CaS, 0.886 g $Al_2S_3$, 0.174 g $Ga_2S_3$, 0.110 g S and 0.090 g $AlCl_3$ were ground together in a mortar and pestle in an argon filled glovebox. The mixture of reactants was divided equally between four sealed fused silica tubes. The tubes were heated together in a box furnace with the following heating profile: ramp from room temperature to 400° C. over 120 min, dwell at 400° C. for 60 min, ramp from 400° C. to 900° C. over 150 min, dwell at 900° C. for 360 min, then ramp to room temperature over 1080 min.

Example 15. $Eu_{0.95}Ca_{0.05}Al_2S_4$: CaS, Eu, Al and S were combined in appropriate ratios with a 35% excess of Al and 10 mg excess S in an Ar filled glove box to form approximately 400 mg of reactants and sealed under vacuum in fused silica tubes. The sample was fired twice at 800° C. with an intermediate grinding with 10 mg excess S in an Ar filled glove box.

Example 16. $Eu_{0.79}Ca_{0.21}Al_2S_4$: 400 mg of europium calcium thioaluminate was prepared with 21 mol % Ca from CaS, Eu, Al, and S with a 35% excess of Al and 10 mg excess S. The precursors were mixed with a mortar and pestle in an Ar-filled glovebox then sealed under vacuum in fused silica tubes. The reaction was done at 800° C. for 12 hours with an intermediate step at 400° C.

Example 17. $Eu_{0.01}Ca_{0.99}Al_3S_{5.5}$ (may be a mixture of $Eu_{0.01}Ca_{0.99}Al_2S_4$ and $Al_2S_3$): A 400 mg batch of europium calcium thioaluminate with 1 mol % Europium was prepared from CaS, $EuF_3$, Al, S, and Eu. 200 mg of the precursor mix was reacted under flowing $H_2S$ at 1000° C. for 90 minutes with a boron oxygen getter.

Example 18. $Eu_{0.02}Ca_{0.98}Al_3S_{5.5}$ (may be a mixture of $Eu_{0.02}Ca_{0.98}Al_2S_4$ and $Al_2S_3$): A 400 mg batch of europium calcium thioaluminate with 2 mol % Europium was prepared from CaS, EuF$_3$, Al, S, and Eu. 200 mg of the precursor mix was reacted at 1000° C. under flowing H$_2$S for 90 minutes with a boron oxygen getter.

Example 19. Eu$_{0.05}$Ca$_{0.95}$Al$_3$S$_{5.5}$ (may be a mixture of Eu$_{0.02}$Ca$_{0.98}$Al$_3$S$_{5.5}$ and Al$_2$S$_3$): A 400 mg batch of europium calcium thioaluminate with 5 mol % Europium was prepared from CaS, EuF$_3$, Al, S, and Eu. 200 mg of the precursor mix was reacted at 1000° C. under flowing H$_2$S for 90 minutes with a boron oxygen getter.

Example 20. Eu$_{0.085}$Ca$_{0.915}$Al$_3$S$_{5.5}$ (may be a mixture of Eu$_{0.085}$Ca$_{0.915}$Al$_2$S$_4$ and Al$_2$S$_3$): A 400 mg batch of europium calcium thioaluminate with 8.5 mol % Europium was prepared from CaS, EuF$_3$, Al, S, and Eu. 200 mg of the precursor mix was reacted at 1000° C. under flowing H$_2$S for 90 minutes with a boron oxygen getter.

Example 21. Eu$_{0.01}$Ca$_{0.88}$Al$_3$S$_{5.5}$ (may be a mixture of Eu$_{0.12}$Ca$_{0.88}$Al$_2$S$_4$ and Al$_2$S$_3$): A 400 mg batch of europium calcium thioaluminate with 12 mol % Europium was prepared from CaS, EuF$_3$, Al, S, and Eu. 200 mg of the precursor mix was reacted at 1000° C. under flowing H$_2$S for 90 minutes with a boron oxygen getter.

Example 22. Eu$_{0.01}$Ca$_{0.99}$Al$_3$S$_{5.5}$ (may be a mixture of Eu$_{0.01}$Ca$_{0.99}$Al$_2$S$_4$ and Al$_2$S$_3$): A 400 mg batch of europium calcium thioaluminate was prepared from CaS, EuF$_3$, Al, and S, with 1 mol % Eu. 1 wt % LiCl was added to the reaction mixture. 200 mg of the precursor mix was reacted at 1000° C. under flowing H$_2$S for 90 mins with a boron oxygen getter.

Example 23. Eu$_{0.02}$Ca$_{0.98}$Al$_3$S$_{5.5}$ (may be a mixture of Eu$_{0.02}$Ca$_{0.98}$Al$_2$S$_4$ and Al$_2$S$_3$): A 400 mg batch of europium calcium thioaluminate was prepared from CaS, EuF$_3$, Al, and S, with 2 mol % Eu. 1 wt % LiCl was added to the reaction mixture. 200 mg of the precursor mix was reacted at 1000° C. under flowing H$_2$S for 90 mins with a boron oxygen getter.

Example 24. Eu$_{0.05}$Ca$_{0.95}$Al$_3$S$_{5.5}$ (may be a mixture of Eu$_{0.05}$Ca$_{0.95}$Al$_2$S$_4$ and Al$_2$S$_3$): A 400 mg batch of europium calcium thioaluminate was prepared from CaS, EuF$_3$, Al, and S, with 5 mol % Eu. 1 wt % LiCl was added to the reaction mixture. 200 mg of the precursor mix was reacted at 1000° C. under flowing H$_2$S for 90 mins with a boron oxygen getter.

Example 25. Eu$_{0.085}$Ca$_{0.915}$Al$_3$S$_{5.5}$ (may be a mixture of Eu$_{0.085}$Ca$_{0.915}$Al$_2$S$_4$ and Al$_2$S$_3$): A 400 mg batch of europium calcium thioaluminate was prepared from CaS, EuF$_3$, Al, and S, with 8.5 mol % Eu. 1 wt % LiCl was added to the reaction mixture. 200 mg of the precursor mix was reacted at 1000° C. under flowing H$_2$S for 90 mins with a boron oxygen getter.

Example 26. Eu$_{0.12}$Ca$_{0.88}$Al$_3$S$_{5.5}$ (may be a mixture of Eu$_{0.12}$Ca$_{0.88}$Al$_2$S$_4$ and Al$_2$S$_3$): A 400 mg batch of europium calcium thioaluminate was prepared from CaS, EuF$_3$, Al, and S, with 12 mol % Eu. 1 wt % LiCl was added to the reaction mixture. 200 mg of the precursor mix was reacted at 1000° C. under flowing H$_2$S for 90 mins with a boron oxygen getter.

Example 27. Eu$_{0.12}$Ca$_{0.88}$Al$_3$S$_{5.5}$ (may be a mixture of Eu$_{0.15}$Ca$_{0.88}$Al$_2$S$_4$ and Al$_2$S$_3$): A 400 mg batch of europium calcium thioaluminate was prepared from CaS, EuF$_3$, Al, and S, with 15 mol % Eu. 1 wt % LiCl was added to the reaction mixture. 200 mg of the precursor mix was reacted at 1000° C. under flowing H$_2$S for 90 mins with a boron oxygen getter.

Example 28. Eu$_{0.20}$Ca$_{0.80}$Al$_3$S$_{5.5}$ (may be a mixture of Eu$_{0.15}$Ca$_{0.88}$Al$_2$S$_4$ and Al$_2$S$_3$): A 400 mg batch of europium calcium thioaluminate was prepared from CaS, EuF$_3$, Al, and S, with 20 mol % Eu. 1 wt % LiCl was added to the reaction mixture. 200 mg of the precursor mix was reacted at 1000° C. under flowing H$_2$S for 90 mins with a boron oxygen getter.

Figure 3:
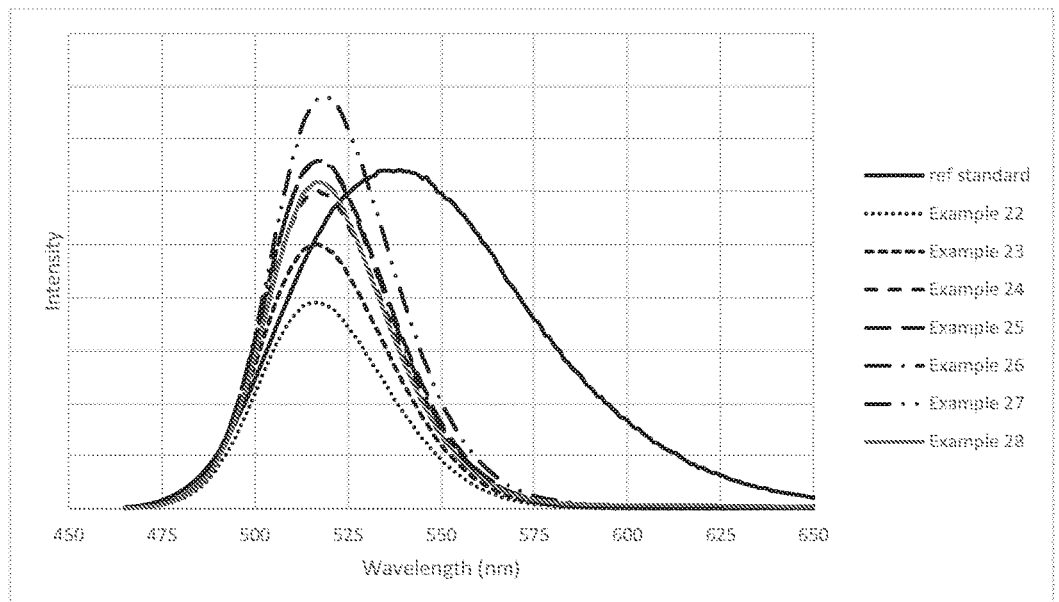
FIG. 3 shows emission spectra for examples 22-28 and for an internal reference standard.

FIG. 3 shows emission spectra for examples 22-28 and for an internal reference standard, with excitation at 450 nm.

Example 29. Eu$_{0.085}$Ca$_{0.915}$Ga$_2$S$_4$: CaS, Eu, Ga$_2$S$_3$, and S were combined in appropriate ratios with a 35% excess of Al and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 30. Eu$_{0.085}$Ca$_{0.915}$Ga$_2$S$_4$: CaS, Eu, Ga$_2$S$_3$, and S were combined in appropriate ratios with a 35% excess of Al and Ga$_2$S$_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 31. Eu$_{0.085}$Ca$_{0.915}$Al$_{0.6}$Ga$_{1.4}$S$_4$: CaS, Eu, Al, Ga$_2$S$_3$, and S were combined in appropriate ratios with a 35% excess of Al and Ga$_2$S$_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 32. Eu$_{0.085}$Ca$_{0.915}$Al$_{0.7}$Ga$_{1.3}$S$_4$: CaS, Eu, Al, Ga$_2$S$_3$, and S were combined in appropriate ratios with a 35% excess of Al and Ga$_2$S$_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 33. Eu$_{0.085}$Ca$_{0.915}$Al$_{0.8}$Ga$_{1.2}$S$_4$: CaS, Eu, Al, Ga$_2$S$_3$, and S were combined in appropriate ratios with a 35% excess of Al and Ga$_2$S$_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 34. $Eu_{0.085}Ca_{0.915}Al_{0.9}Ga_{1.1}S_4$: CaS, Eu, Al, $Ga_2S_3$, and S were combined in appropriate ratios with a 35% excess of Al and $Ga_2S_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 35. $Eu_{0.085}Ca_{0.915}Al_1Ga_1S_4$: CaS, Eu, Al, $Ga_2S_3$, and S were combined in appropriate ratios with a 35% excess of Al and $Ga_2S_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 36. $Eu_{0.085}Ca_{0.915}Al_1Ga_1S_4$: CaS, Eu, Al, $Ga_2S_3$, and S were combined in appropriate ratios with a 35% excess of Al and $Ga_2S_3$ and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Example 37. $Eu_{0.085}Ca_{0.915}Al_1Ga_1S_4$: CaS, Eu, Al, $Ga_2S_3$, and S were combined in appropriate ratios with a 35% excess of Al and 10 mg excess S in an Ar filled glove box to form approximately 400 mg of reactants and sealed under vacuum in a fused silica tube. The tube was heated using the following heating profile 290° C. (17 h), 770° C. (24 h), 870° C. (24 h) before cooling to room temperature. The sample was given an intermediate grinding with 10 mg excess S in an Ar filled glove box, sealed under vacuum in a fused silica tube and heated using a second heating profile: 400° C. (6 h), 1000° C. (3 h) before cooling to room temperature. PXRD shows a majority of the desired phase.

Figure 4:
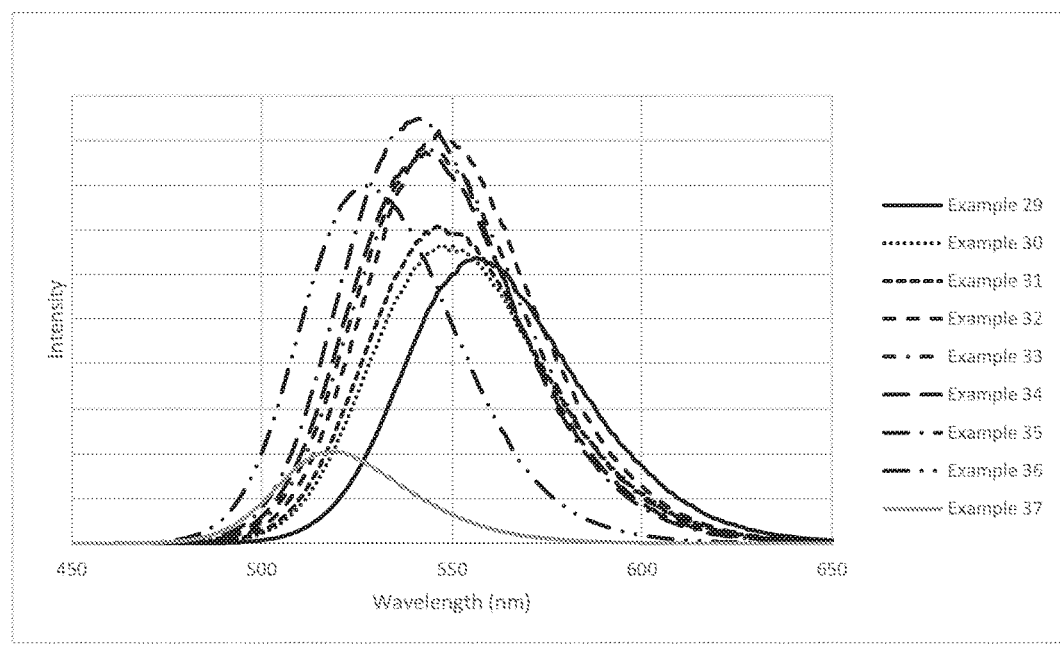
FIG. 4 shows emission spectra for examples 29-37.
Figure 5:
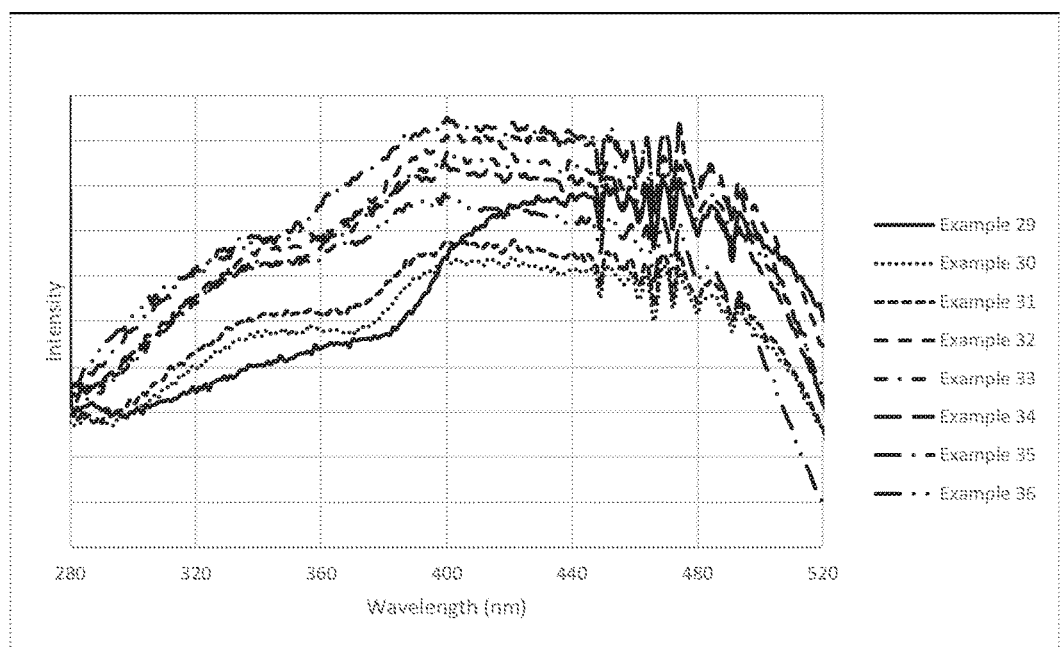
FIG. 5 shows excitation spectra for examples 29-36.
Figure 6A:
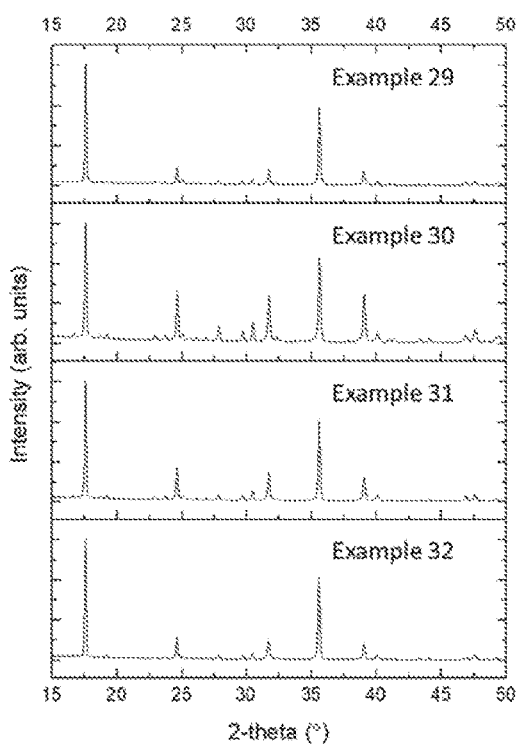
FIG. 6A and FIG. 6B show, respectively, x-ray powder diffraction profiles for examples 29-32 and examples 33-36.
Figure 6B:
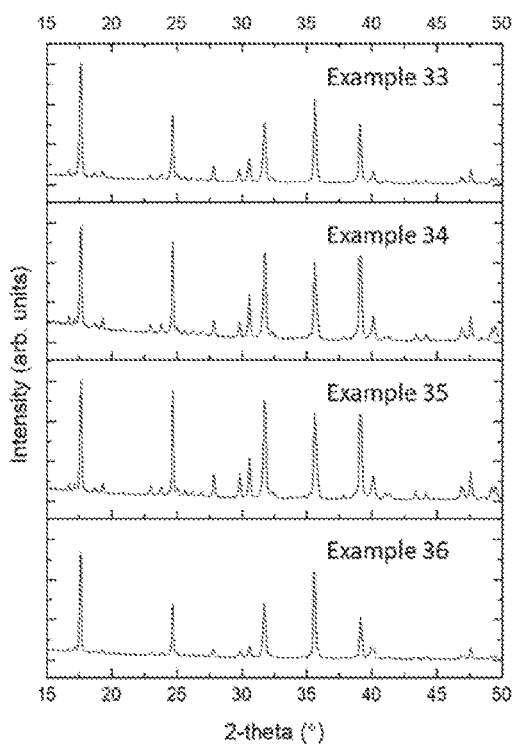

FIG. 4 shows emission spectra for examples 29-37 with excitation at 395 nm. FIG. 5 shows excitation spectra for examples 29-36 with emission monitored at the emission maximum. FIG. 6A shows X-ray powder diffraction profiles for examples 29-32. FIG. 6B shows X-ray powder diffraction profiles for examples 33-36.

Example 38. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): CaS, Eu, Al, $Ga_2S_3$ and S were combined in appropriate amounts and reacted under flowing $H_2S$.

Example 39. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 38, however, used EuS instead of Eu metal as europium source. CaS, EuS, Al, $Ga_2S_3$ and S were combined in appropriate amounts and reacted under flowing $H_2S$.

Example 40. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 38, however, used $EuF_3$ instead of Eu metal as europium source. CaS, $EuF_3$, Al, $Ga_2S_3$ and S were combined in appropriate amounts and reacted under flowing $H_2S$.

Example 41. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 40, however, no elemental sulfur was used in the initial formulation. CaS, $EuF_3$, Al, and $Ga_2S_3$ were combined in appropriate amounts and reacted under flowing $H_2S$.

Example 42. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 40, however, 5% of the CaS was substituted with $CaCO_3$ in the initial formulation. CaS, $CaCO_3$, $EuF_3$, Al, $Ga_2S_3$, and S were combined in appropriate amounts and reacted under flowing $H_2S$.

Example 43. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 40, however, 5% of the CaS was substituted with $CaF_2$ in the initial formulation. CaS, $CaF_2$, $EuF_3$, Al, $Ga_2S_3$, and S were combined in appropriate amounts and reacted under flowing $H_2S$.

Example 44. $Eu_{0.085}Ca_{0.915}Al_{2.64}Ga_{0.36}S_{5.5}$ (may be a mixture of $Eu_{0.085}Ca_{0.915}Al_{1.76}Ga_{0.24}S_4$ and $(Al,Ga)_2S_3$): Identical to example 41, however, used EuS rather than $EuF_3$ in the initial formulation. CaS, EuS, Al, and $Ga_2S_3$ were combined in appropriate amounts and reacted under flowing $H_2S$.

Table 1 below summarizes emission properties of $Eu_{1-w}Sr_wM_xS_y$ phosphor examples 1-44.

For comparison, samples from examples 11 and 12 were left out overnight in air. After overnight exposure to atmospheric moisture, example 11 (50% Eu) was still bright green and emitted brightly under illumination from a violet LED. In contrast, example 12 (8.5% Eu) was much paler and barely emissive.

Example $Eu_{1-w}Sr_wM_xS_y$ Phosphors

Magnesium doped samples were prepared from stoichiometric mixes of Eu, Mg, Al, S, powders and $Ga_2S_3$ powder, when appropriate, with a 35% excess of Al and $Ga_2S_3$, when appropriate, and 10 mg excess S which were ground together in an argon filled glovebox and sealed in a quartz tube. The samples were heated in a box furnace to 400° C. for 6 hours then 800° C. for 12 hours. XRD showed varying levels of $EuAl_2S_4$, $MgAl_2S_4$ and EuS. Each sample showed emission around 500 nm and a shoulder around 450 nm when excited at 395 nm. An excitation scan with emission monitored at 500 nm showed an excitation maximum at about 390 nm, with a gradual decrease in excitation intensity to about 460 nm, followed by a sharp decrease in excitation intensity that decreases below about 30% by 490 nm. The decrease in excitation intensity is more pronounced with increasing Mg content. These results indicate Mg incorporation into the $EuAl_2S_4$, as well as some Eu doped $MgAl_2S_4$.

Second firing: Samples were ground again with a mortar and pestle under an argon atmosphere and sealed in a quartz tube. The samples were heated again in a box furnace to 400° C. for 6 hours then 800° C. for 12 hours. Again, XRD showed varying levels of $EuAl_2S_4$, $MgAl_2S_4$ and EuS. With 395 nm excitation, only the emission peak ca. 500 nm was observed. There is a slight decrease in peak emission wavelength with the reaction stoichiometry that has Mg present in at least a two-fold excess compared to Eu. The excitation spectra follow a similar trend as noted after the first firing, peaking around 385 nm, and gradually decreasing to about 460 nm, where the extent of excitation intensity decrease is more pronounced with increased Mg content in reaction mixture.

Third firing: Samples were ground again with a mortar and pestle under an argon atmosphere with 10 weight percent sulfur added. The samples were heated to 400° C. for 6 hours then 900° C. for 24 hours. XRD showed varying levels of $EuAl_2S_4$, and $MgAl_2S_4$ commensurate with reaction stoichiometry. With 395 nm excitation, only the emission peak ca. 500 nm was observed. There is a slight decrease in peak emission wavelength when the reaction stoichiometry has Mg present in at least a two-fold excess compared to Eu. The excitation spectra show a marked difference, as the excitation maxima which were previously around 385 nm have shifted to approximately 455 nm.

After Second Firing
Example 45. $Eu_{0.95}Mg_{0.05}Al_2S_4$
Example 46. $Eu_{0.86}Mg_{0.14}Al_{1.72}Ga_{0.28}S_4$
Example 47. $Eu_{0.79}Mg_{0.21}Al_2S_4$
Example 48. $Eu_{0.65}Mg_{0.35}Al_2S_4$
Example 49. $Eu_{0.50}Mg_{0.50}Al_2S_4$
Example 50. $Eu_{0.34}Mg_{0.66}Al_2S_4$
Example 51. $Eu_{0.10}Mg_{0.90}Al_2S_4$ After Third Firing
Example 47. $Eu_{0.79}Mg_{0.21}Al_2S_4$
Example 48. $Eu_{0.65}Mg_{0.35}Al_2S_4$
Example 49. $Eu_{0.50}Mg_{0.50}Al_2S_4$
Example 50. $Eu_{0.34}Mg_{0.66}Al_2S_4$
Example 51. $Eu_{0.10}Mg_{0.90}Al_2S_4$ Table 2 below shows the emission properties of examples 45-51 after the second firing. Table 3 below shows the emission properties of examples 47-51 after the third firing.

Figure 7:
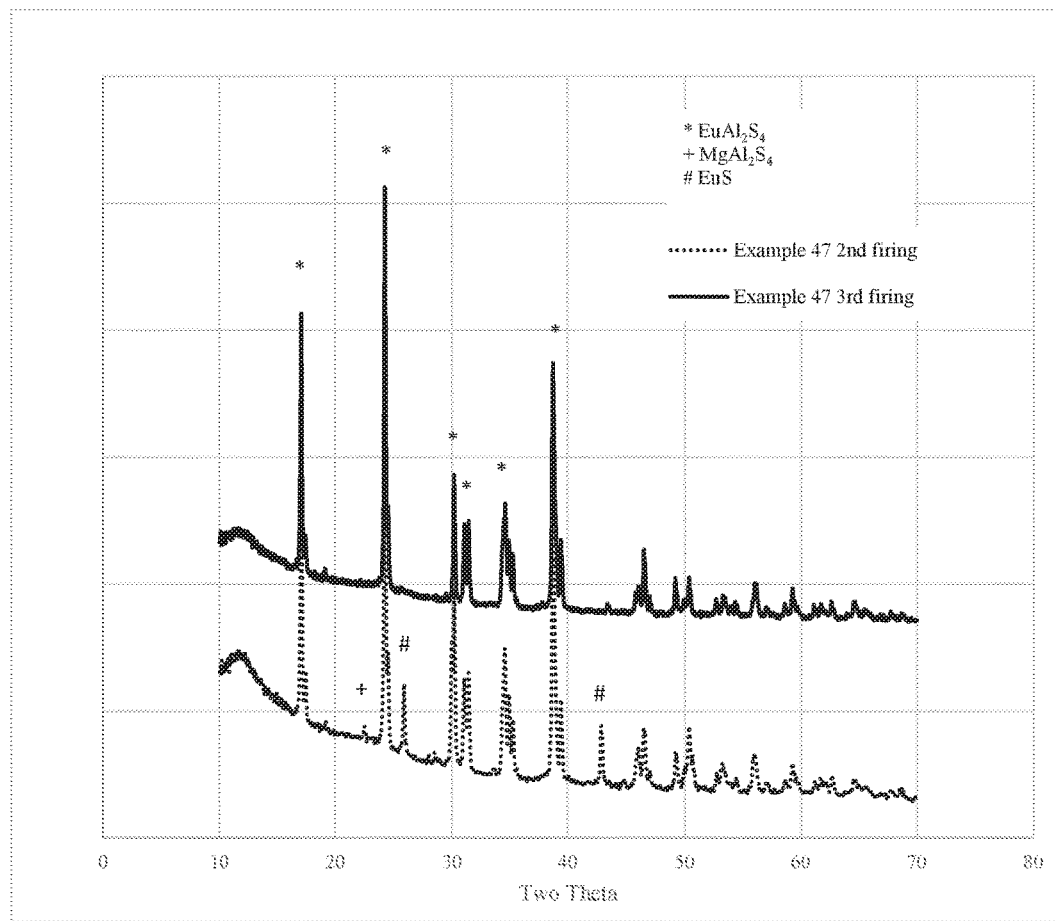
FIG. 7 shows X-ray powder diffraction profiles for example 47 after second and third firings.
Figure 8:
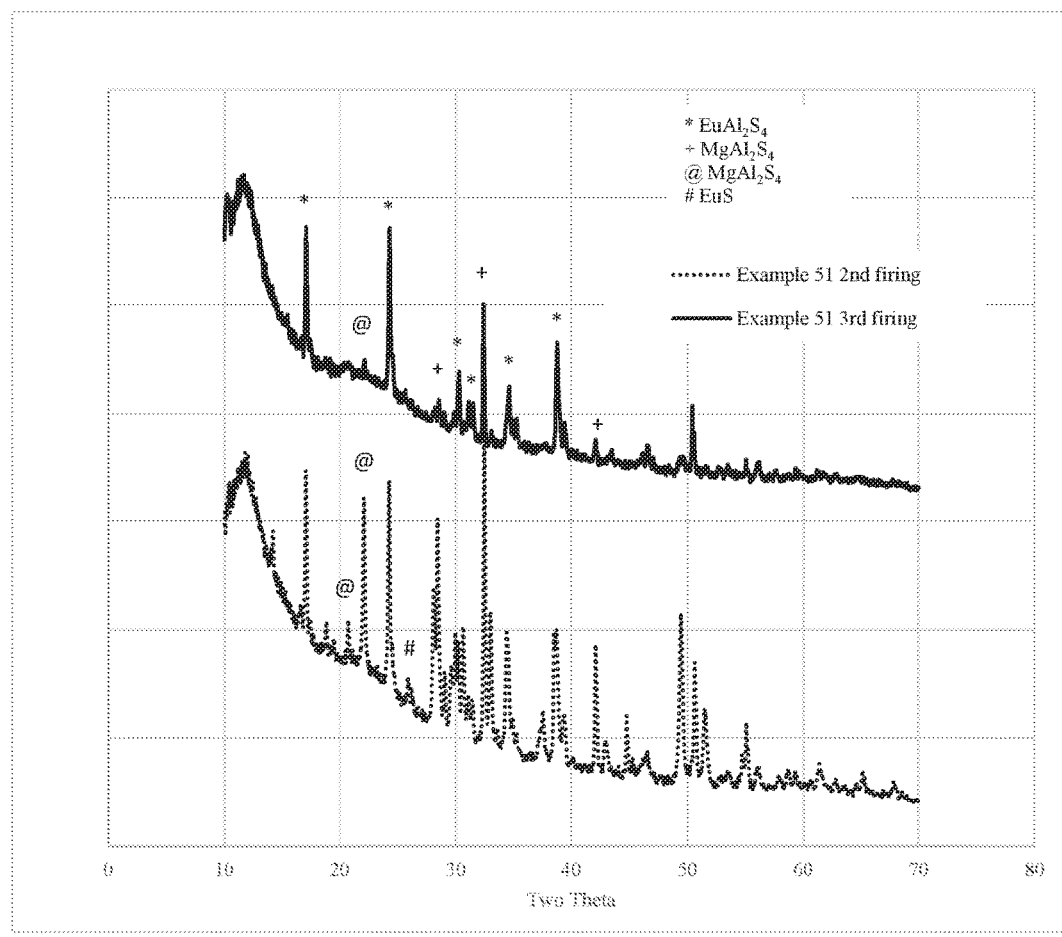
FIG. 8 shows X-ray powder diffraction profiles for example 51 after second and third firings.

FIG. 7 shows the X-ray powder diffraction profile for example 47 after the second and third firings. FIG. 8 shows the X-ray powder diffraction profile for example 51 after the second and third firings.

Figure 9:
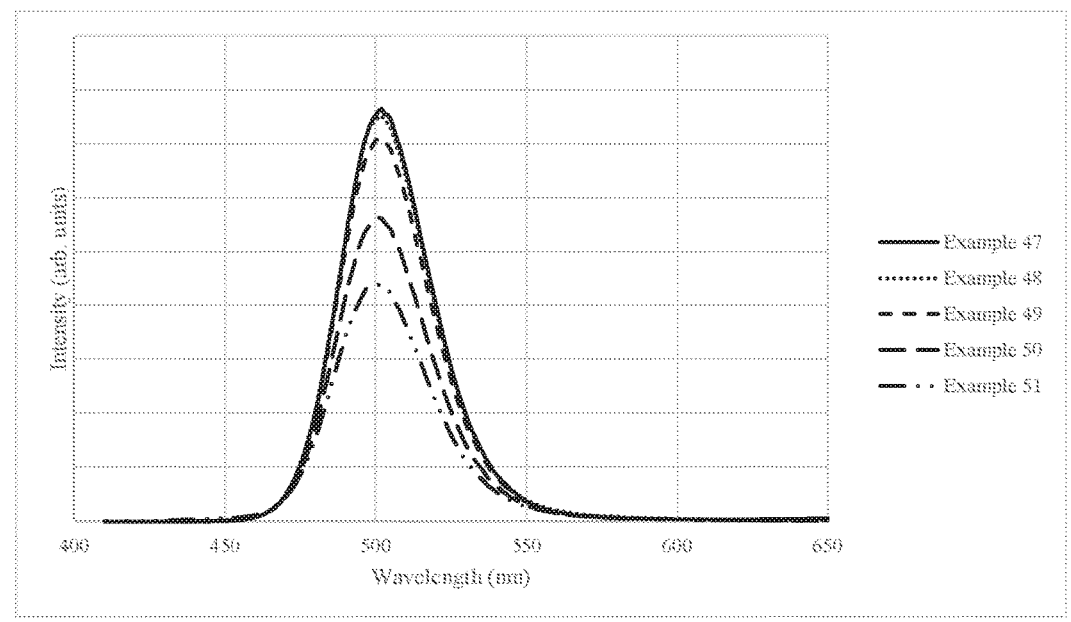
FIG. 9 emission spectra for examples 47-51 after a second firing.
Figure 10:
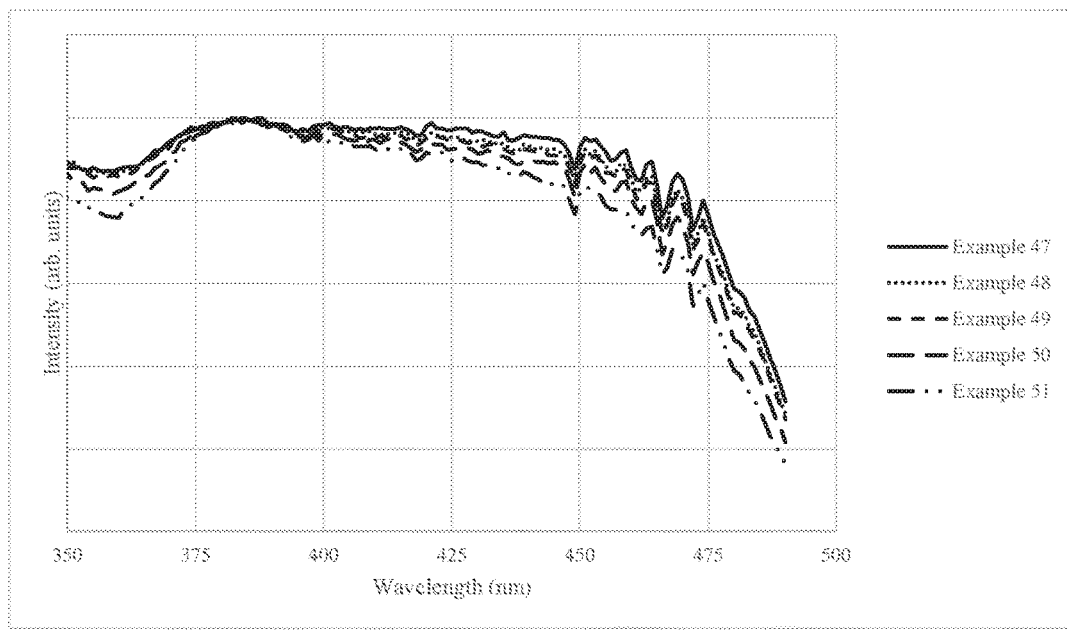
FIG. 10 shows excitation spectra for examples 47-51 after a second firing.

FIG. 9 shows the emission spectra for examples 47-51 after the second firing, with excitation at 395 nm. FIG. 10 shows the excitation spectra for examples 47-51 after the second firing, with emission monitored at 500 nm.

Figure 11:
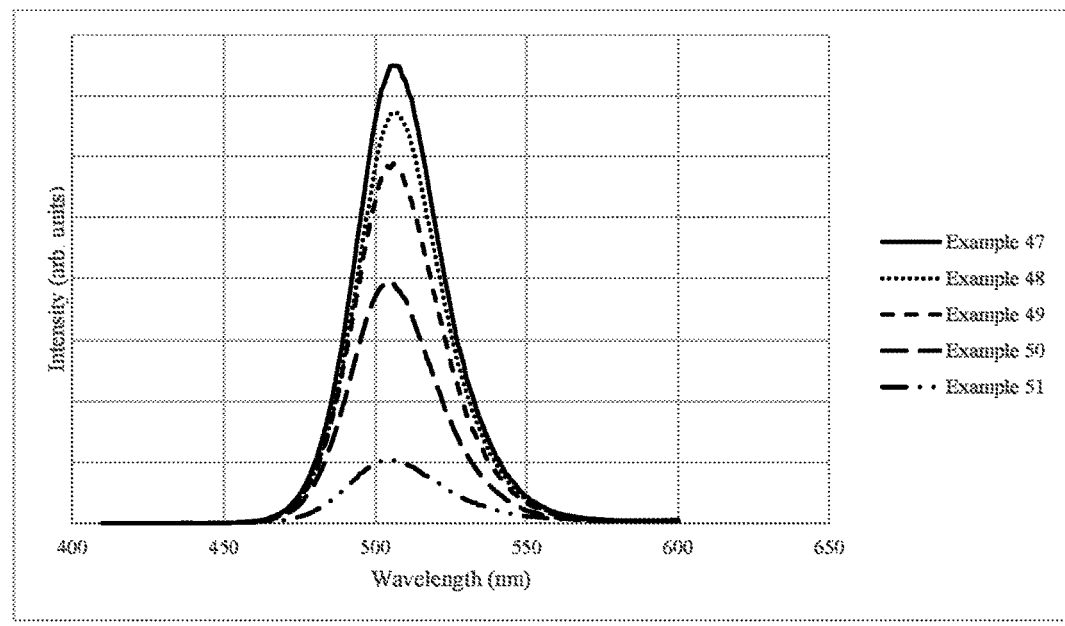
FIG. 11 shows emission spectra for examples 47-51 after a third firing.
Figure 12:
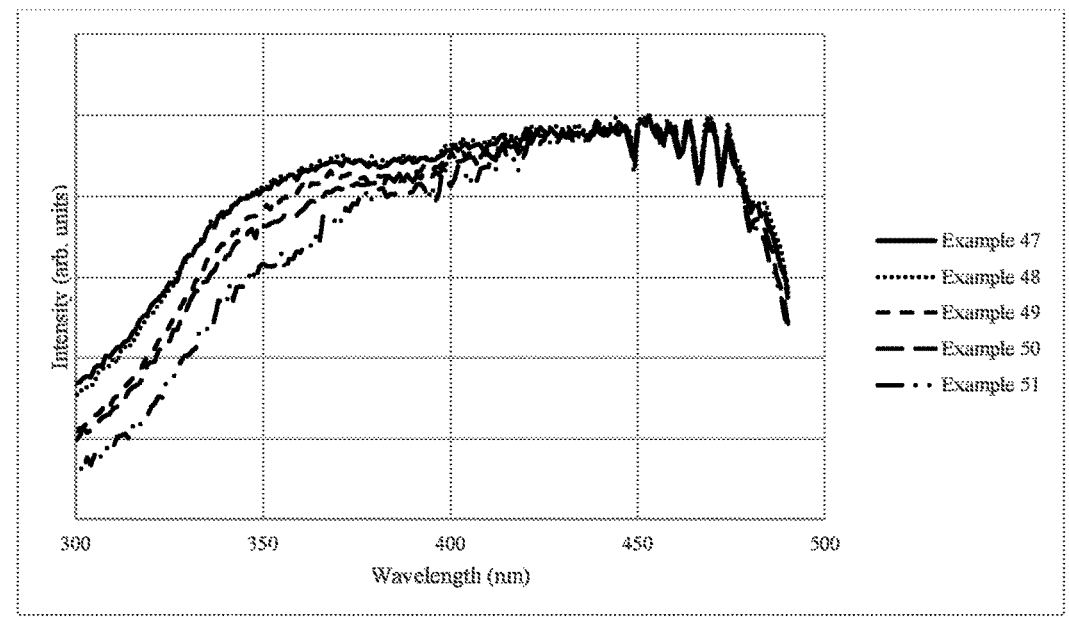
FIG. 12 shows excitation spectra for examples 47-51 after a third firing.

FIG. 11 shows the emission spectra for examples 47-51 after the third firing, with excitation at 395 nm. FIG. 12 shows the excitation spectra for examples 47-51 after the third firing, with emission monitored at 500 nm.

Example $Eu_{1-w}Sr_wM_xS_y$ Phosphors

Strontium doped samples were prepared from stoichiometric mixes of Eu, SrS, Al, and S powders with a 35% excess of Al and 10 mg excess S which were ground together in an argon filled glovebox and sealed in a quartz tube. The samples were heated in a box furnace to 400° C. for 6 hours then 800° C. for 12 hours. Excitation scans with emission monitored at 500 nm showed an excitation maximum at about 380 nm, with a gradual decrease in excitation intensity to about 450 nm, followed by a sharp decrease in excitation intensity that decreases below about 25% by 490 nm. The decrease in excitation intensity towards 450 nm is more pronounced with increasing Sr content.

Example 52. $Eu_{0.95}Sr_{0.05}Al_2S_4$
Example 53. $Eu_{0.79}Sr_{0.21}Al_2S_4$

Figure 13:
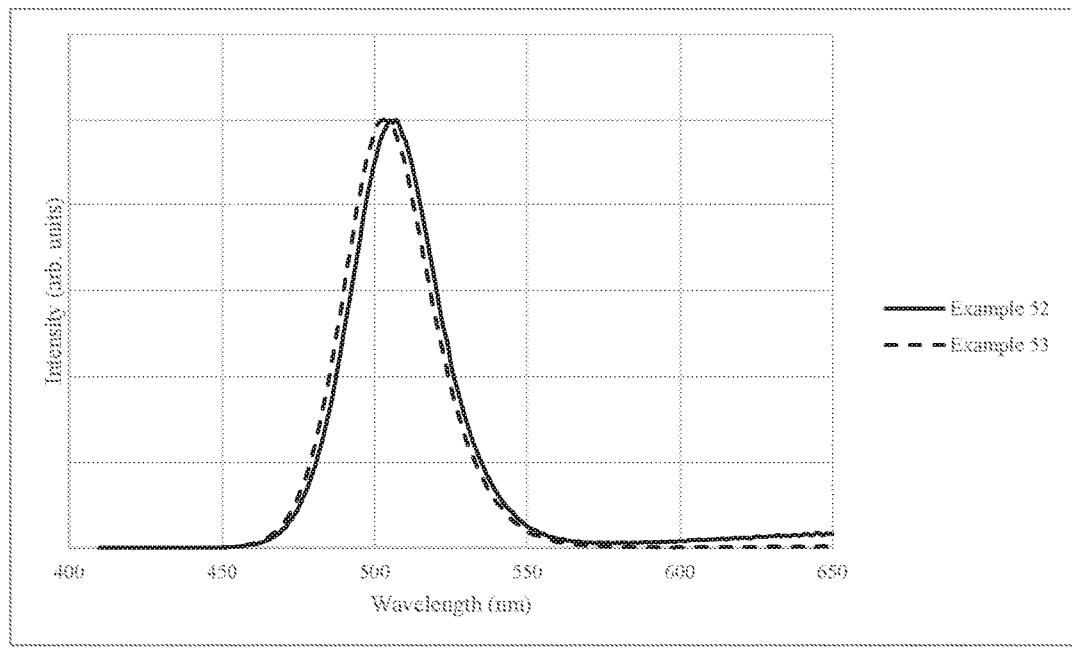
FIG. 13 shows emission spectra for examples 52 and 53.

FIG. 13 shows the emission spectra for examples 52 and 53, with excitation at 395 nm. Table 4 below shows the emission properties for examples 52 and 53.

Example $Eu_{1-w}Ba_wM_xS_y$ Phosphors

Barium sulfide was combined with elemental europium, aluminum, and sulfur in appropriate stoichiometric amounts, with a 35% excess of aluminum and a 20% excess of sulfur, forming approximately 400 mg of starting reactant mixture. This mixture was ground with a mortar and pestle and sealed under vacuum in a fused silica tube. The samples were heated to 400° C. over 4 hours, held at temperature for 4 hours, ramped up to 800° C. over 4 hours, held at temperature for 10 hours, then cooled to room temperature over a period of 6 hours. Samples were reground with an additional 10 mg of sulfur under argon, then sealed and heated again under the same profile.

Figure 14:
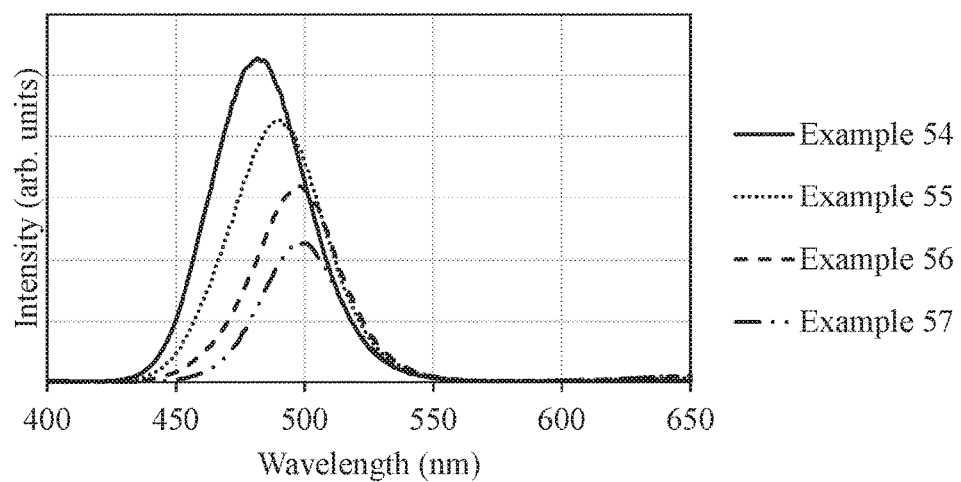
FIG. 14 shows the emission spectra for examples 54 to 57.
Figure 15:
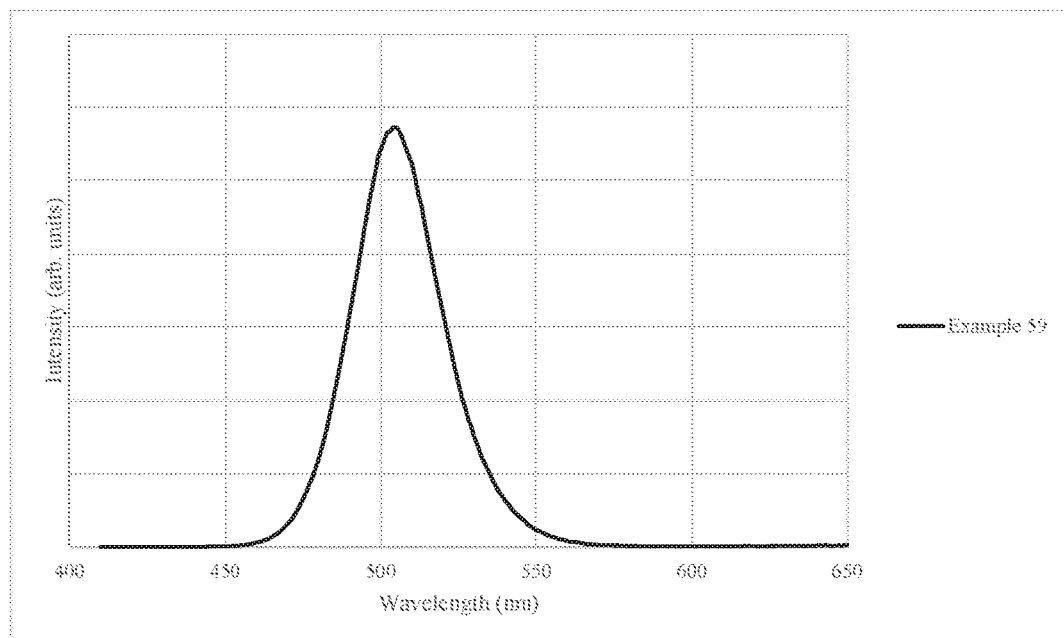
FIG. 15 shows the emission spectrum for example 59.
Figure 16:
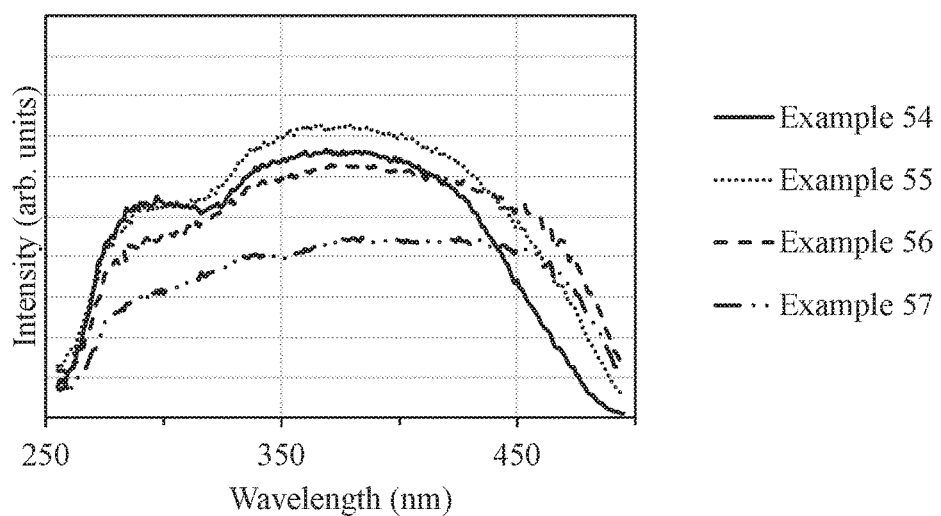
FIG. 16 shows excitation spectra for examples 54 to 57.

Example 54. $Eu_{0.10}Ba_{0.90}Al_2S_4$
Example 55. $Eu_{0.25}Ba_{0.75}Al_2S_4$
Example 56. $Eu_{0.40}Ba_{0.60}Al_2S_4$
Example 57. $Eu_{0.50}Ba_{0.50}Al_2S_4$
Example 58. $Eu_{0.79}Ba_{0.21}Al_2S_4$
Example 59. $Eu_{0.95}Ba_{0.05}Al_2S_4$ FIG. 14 shows the emission spectra for examples 54 to 57, with excitation at 395 nm. FIG. 15 shows the emission spectrum for example 59, with excitation at 395 nm. FIG. 16 shows the excitation spectra for examples 54 to 57, with emission monitored at 500 nm. Table 5 below shows the emission properties for examples 54-59.

Figure 17:
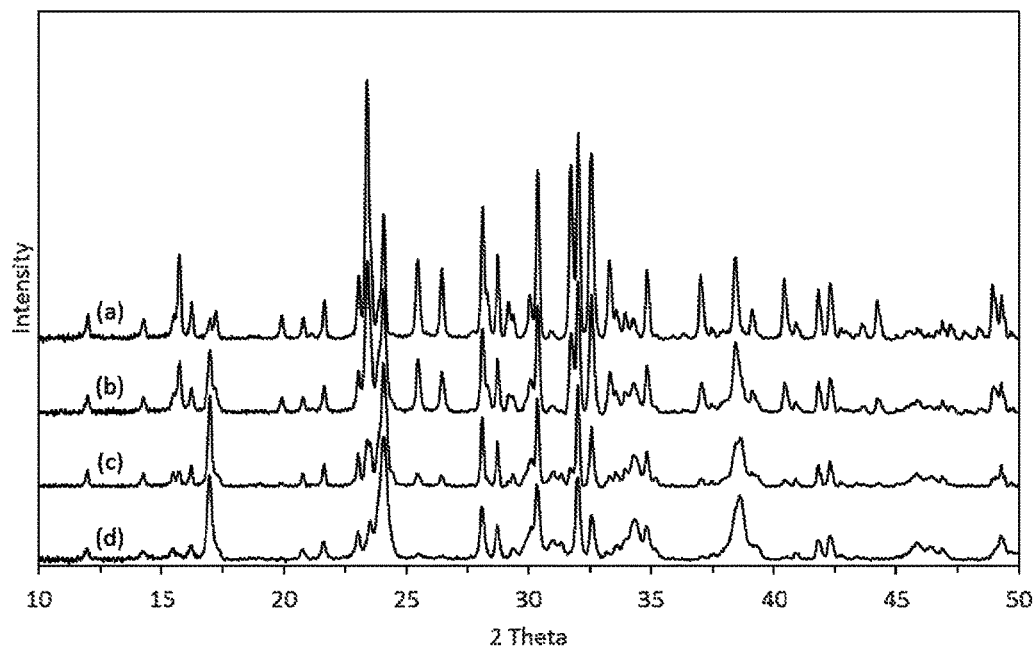
FIG. 17 shows X-ray powder diffraction profiles for examples 54 to 57.

FIG. 17 shows the X-ray powder diffraction profiles for examples 54 to 57 labeled as (a)-(d), respectively, in the figure.

Fabrication of Example Phosphor-Converted LEDs

Figure 18:
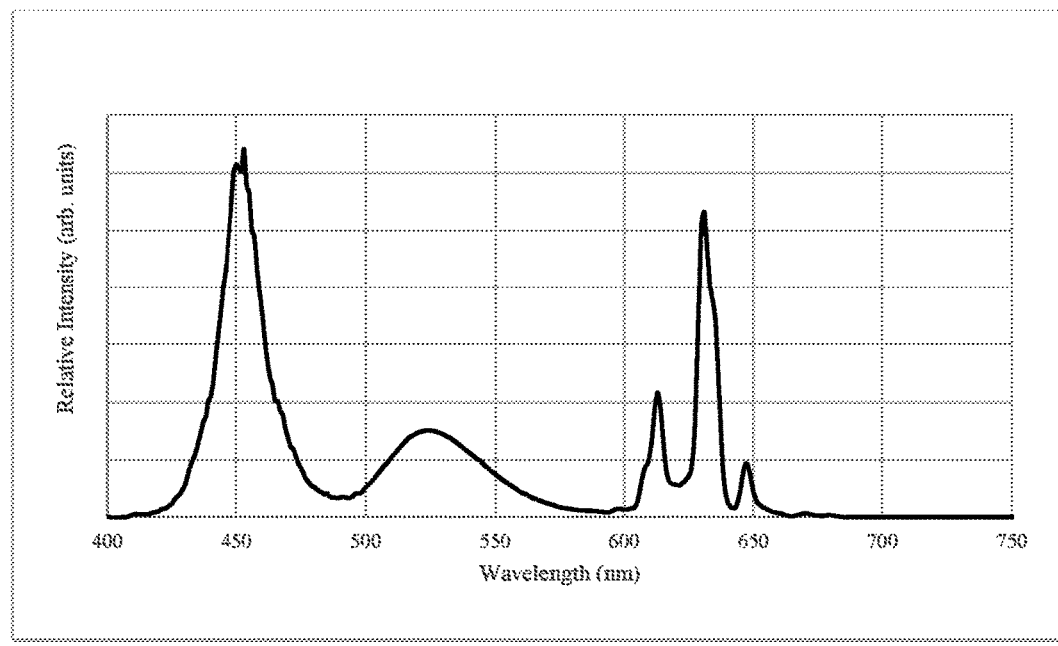
FIG. 18 shows the emission spectrum for example phosphor-converted LED 1.

LED example 1. A phosphor-converted LED was fabricated with phosphor example 12, a red PFS phosphor, and a Plessey 3535 LED package with 450 peak blue. The color point of the emission spectrum is CIE x,y 0.2478, 0.1954. This example is suitable for backlighting applications. The spectral power distribution for this example is shown in FIG. 18.

Figure 19:
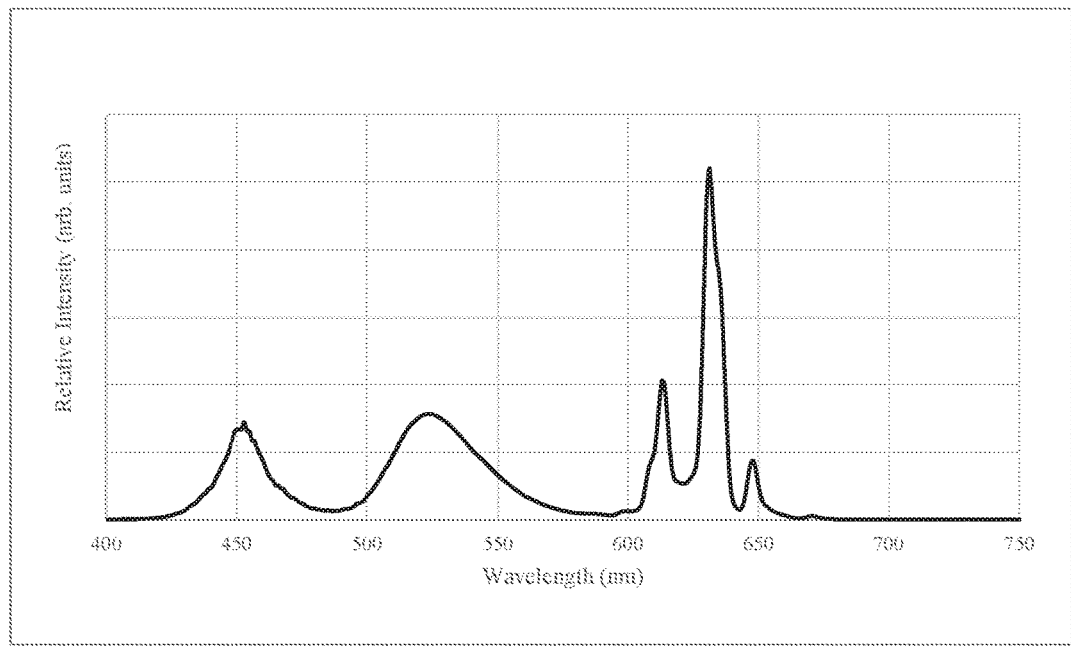
FIG. 19 shows the emission spectrum for example phosphor-converted LED 2.

LED example 2. A phosphor converted LED was fabricated with phosphor example 6, a red PFS phosphor, and a Plessey 3535 LED package with 450 nm peak blue. The color point of the emission spectrum is CIE x,y 0.3446, 0.365. The color temperature is 5062 K, duv is ~0.0036, and Ra is ~47. Although this LED would not be suitable for most lighting applications, it illustrates a white color point. The spectral power distribution of this LED is shown in FIG. 19.

Figure 20:
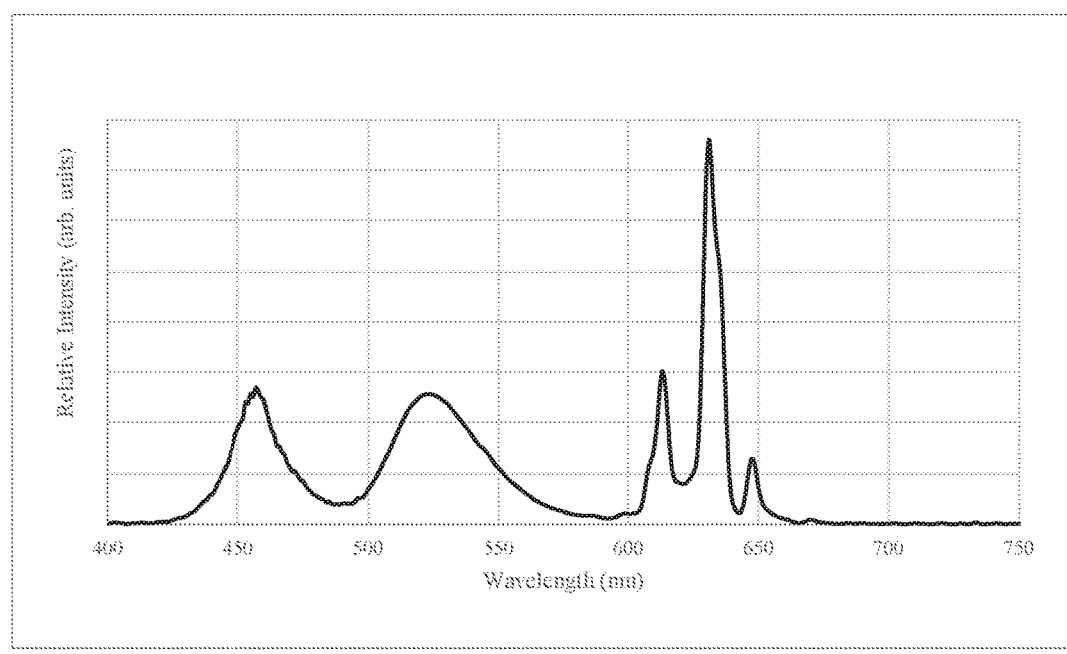
FIG. 20 shows the emission spectrum for example phosphor-converted LED 3.

LED example 3. A phosphor converted LED was fabricated with phosphor example 6, a red PFS phosphor, and a PowerOpto 457 nm LED (2835 packages). The color point of the emission spectrum is CIE x,y 0.3184, 0.3516. The color temperature is 6102 K, duv is ~0.0084, and Ra is ~55.5. The spectral power distribution of this LED is shown in FIG. 20.

Figure 21:
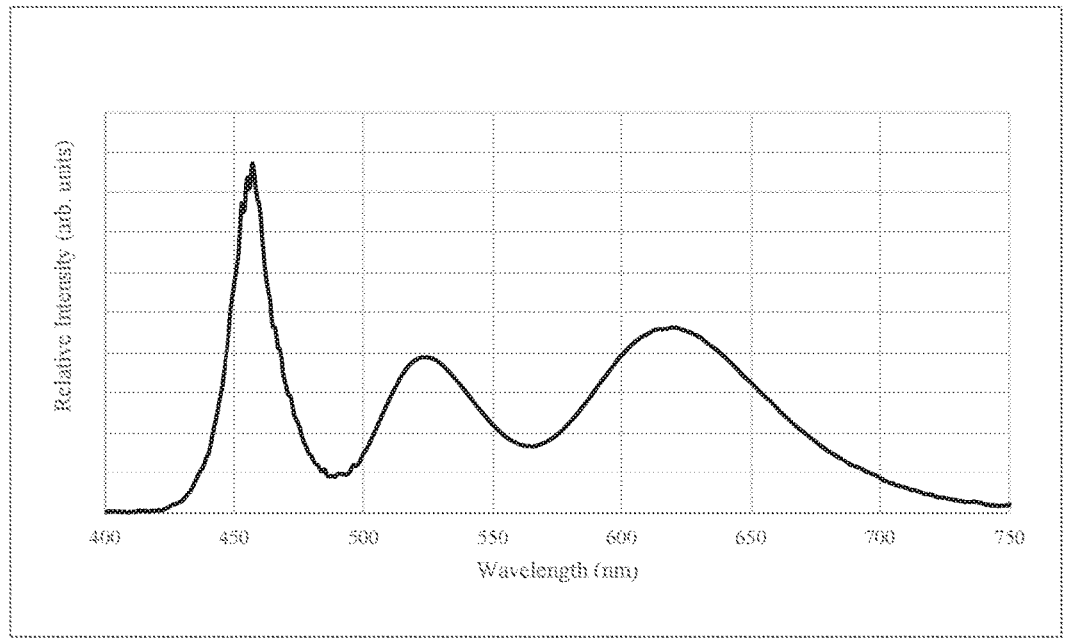
FIG. 21 shows the emission spectrum for example phosphor-converted LED 4.

LED example 4. A phosphor converted LED was fabricated with phosphor example 7, a BR102Q red phosphor, and a PowerOpto 457 nm LED (2835 package). The color point of the emission spectrum is CIE x,y 0.3517, 0.3134. The color temperature is 4508 K, duv is ~0.023, and Ra is ~76. The spectral power distribution of this LED is shown in FIG. 21.

Figure 22:
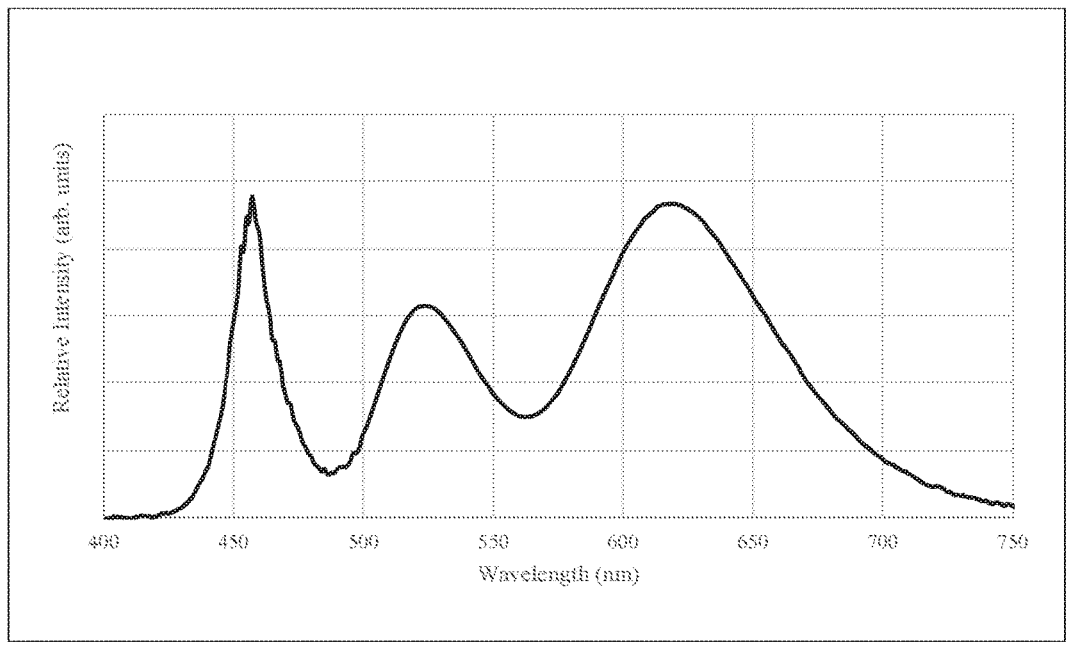
FIG. 22 shows the emission spectrum for example phosphor-converted LED 5.

LED example 5. A phosphor converted LED was fabricated with phosphor example 7, a BR102Q red phosphor, and a PowerOpto 457 nm LED (2835 package). The color point of the emission spectrum is CIE x,y 0.4065, 0.3571. 3165 K, duv is ~0.0156, Ra is ~81, and R9 is ~77. The spectral power distribution of this LED is shown in FIG. 22.

Figure 23:
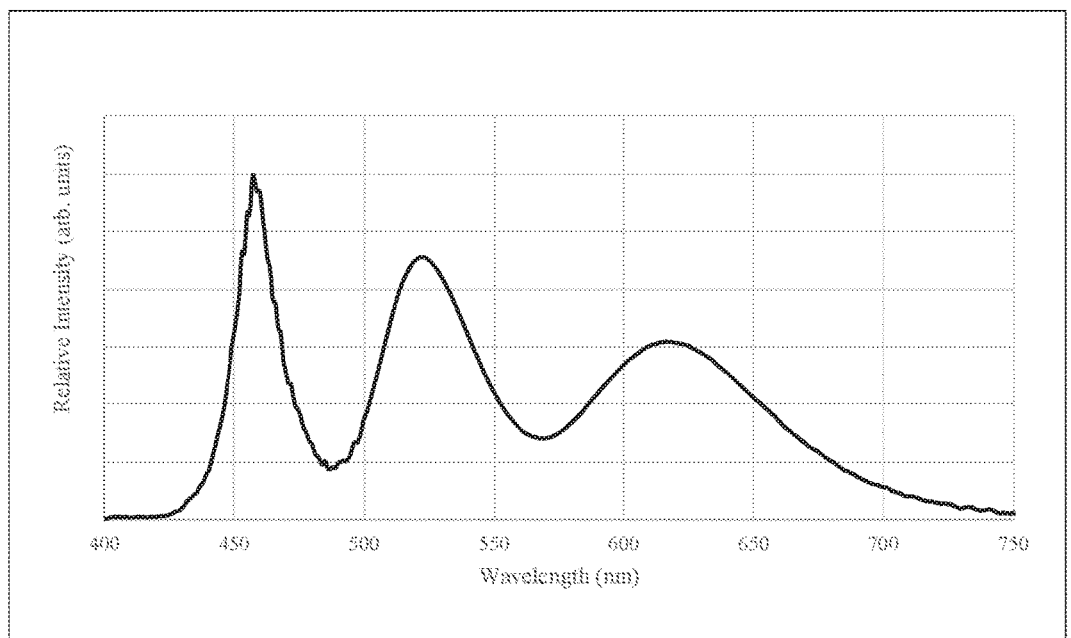
FIG. 23 shows the emission spectrum for example phosphor-converted LED 6.

LED example 6. A phosphor converted LED was fabricated with phosphor example 4, a BR102Q red phosphor, and a PowerOpto 457 nm LED (2835 package). The color point of the emission spectrum is CIE x,y 0.3298, 0.3620. The color temperature is 5610 K, duv is ~0.0082, Ra is ~89, and R9 is ~70. The spectral power distribution of this LED is shown in FIG. 23.

TABLE 1

Emission properties of $Eu_{1-w}Ca_wM_xS_y$ phosphors.

| Example | Peak, nm | FWHM, nm | Peak Intensity Relative to an Internal Reference |
|---|---|---|---|
| Example 1 | 518 | 39.0 | 80% |
| Example 2 | 520 | 39.5 | 85% |
| Example 3 | 521 | 40.5 | 75% |
| Example 4 | 522 | | |
| Example 5 | 521 | 43.5 | 85% |
| Example 6 | 524 | | |
| Example 7 | 524 | | |
| Example 8 | 521 | 43.5 | 28% |
| Example 9 | 526 | 41 | 94% |
| Example 10 | 523 | 42 | 76% |
| Example 11 | 521 | 42 | 96% |
| Example 12 | 529 | 43 | 106% |
| Example 13 | 511 | 31 | |
| Example 14 | 517 | 36 | |
| Example 15 | 508 | 32 | |
| Example 16 | 509 | 33 | |
| Example 17 | 517 | 38 | 48% |
| Example 18 | 516 | 39 | 63% |
| Example 19 | 517 | 37 | 85% |
| Example 20 | 517 | 37 | 100% |
| Example 21 | 517 | 37 | 97% |
| Example 22 | 517 | 39 | 61% |
| Example 23 | 517 | 39 | 78% |
| Example 24 | 517 | 39 | 94% |
| Example 25 | 517 | 38 | 103% |
| Example 26 | 517 | 37 | 103% |
| Example 27 | 518 | 38 | 122% |
| Example 28 | 517 | 37 | 96% |
| Example 29 | 556 | 52 | |
| Example 30 | 550 | 51 | |
| Example 31 | 546 | 51 | |
| Example 32 | 546 | 51 | |
| Example 33 | 546 | 50 | |
| Example 34 | 543 | 50 | |
| Example 35 | 541 | 50 | |
| Example 36 | 528 | 46 | |
| Example 37 | 518 | 35 | |
| Example 38 | 521 | | 87% |
| Example 39 | 521 | | 93% |
| Example 40 | 521 | | 92% |
| Example 41 | 518 | | 49% |
| Example 42 | 521 | | 65% |
| Example 43 | 519 | | 62% |
| Example 44 | | | |

TABLE 2

Emission properties of $Eu_{1-w}Mg_wM_xS_y$ phosphors after second firing

| Example | Peak, nm 2nd firing | relative emission intensity* | relative excitation intensity at 453 nm versus peak excitation |
|---|---|---|---|
| Example 45 | 506 | | |
| Example 46 | 508 | | |
| Example 47 | 502 | 100% | 95% |
| Example 48 | 502 | 98% | 92% |
| Example 49 | 502 | 93% | 91% |
| Example 50 | 501 | 74% | 88% |
| Example 51 | 499 | 58% | 83% |

TABLE 3

Emission properties of $Eu_{1-w}Mg_wM_xS_y$ phosphors after third firing

| Example | Peak, nm 3rd firing |
|---|---|
| Example 47 | 506 |
| Example 48 | 507 |
| Example 49 | 506 |
| Example 50 | 504 |
| Example 51 | 503 |

TABLE 4

Emission properties of $Eu_{1-w}Sr_wM_xS_y$ phosphors

| Example | Peak | FWHM |
|---|---|---|
| Example 52 | 507 | 33 |
| Example 53 | 503 | 32 |

TABLE 5

Emission properties of $Eu_{1-w}Ba_wM_xS_y$ phosphors

| Example | Peak (nm) | FWHM (nm) | Phases Present in XRD |
|---|---|---|---|
| Example 54 | 482 | 44 | $BaAl_2S_4$, $BaAl_4S_7$, $EuAl_2S_4$ |
| Example 55 | 491 | 43 | $BaAl_2S_4$, $BaAl_4S_7$, $EuAl_2S_4$ |
| Example 56 | 497 | 38 | $BaAl_4S_7$, $EuAl_2S_4$ |
| Example 57 | 498 | 35 | $BaAl_4S_7$, $EuAl_2S_4$ |
| Example 58 | 502 | 33 | |
| Example 59 | 505 | 32 | $BaO$, $EuAl_2S_4$ |

This disclosure is illustrative and not limiting. Further modifications will be apparent to one skilled in the art in light of this disclosure and are intended to fall within the scope of the appended claims.

What is claimed is:

1. A light emitting device comprising:
a light emitting diode that emits primary light; and
a $RE_{1-w}A_wM_xE_y$ phosphor material capable of absorbing at least a portion of the primary light and in response emitting secondary light having a wavelength longer than a wavelength of the primary light;
wherein:
RE is a Rare Earth element or a mixture of Rare Earth elements;
A is selected from the group consisting of Magnesium, Calcium, Strontium, Barium, and mixtures thereof;
M is selected from the group consisting of Aluminum, Gallium, Boron, Indium, Scandium, Lutetium, Yttrium, and mixtures thereof;
E comprises Sulfur, or Selenium, or Sulfur and Selenium, and optionally Oxygen, Tellurium, or Oxygen and Tellurium;
$0.01 \leq w \leq 0.8$;
$2 \leq x \leq 4$; and
$4 \leq y \leq 7$.

2. The light emitting device of claim 1, wherein RE is Europium.

3. The light emitting device of claim 1, wherein $0.30 \leq w \leq 0.66$.

4. The light emitting device of claim 1, wherein the $RE_{1-w}A_wM_xE_y$ phosphor has exclusively an $EuM_2E_4$ pseudoorthorhombic crystal structure.

5. The light emitting device of claim 1, wherein the $RE_{1-w}A_wM_xE_y$ phosphor has a mixture of predominantly an $EuM_2E_4$ pseudoorthorhombic crystal structure and one or more binary chalcogenide crystal structures.

6. The light emitting device of claim 1, wherein the light emitting diode is a laser diode.

7. The light emitting device of claim 1, wherein the primary light has a wavelength between about 380 nanometers and about 500 nanometers.

8. The light emitting device of claim 7, wherein the primary light is blue light.

9. The light emitting device of claim 1, wherein the secondary light has a wavelength between about 475 nanometers and about 560 nanometers.

10. The light emitting device of claim 1, wherein:
RE is Europium; and
$0.30 \leq w \leq 0.66$.

11. The light emitting device of claim 10, wherein the $RE_{1-w}A_wM_xE_y$ phosphor has exclusively an $EuM_2E_4$ pseudoorthorhombic crystal structure.

12. The light emitting device of claim 10, wherein the primary light is blue light.

13. The light emitting device of claim 1, comprising a second phosphor material capable of absorbing at least a portion of the primary light and in response emitting red light; wherein the combined emission from the light emitting device of unabsorbed primary light, the secondary light, and the red light appears white to a human observer with normal color vision.

14. The light emitting device of claim 13, wherein:
RE is Europium; and
$0.30 \leq w \leq 0.66$.

15. The light emitting device of claim 14, wherein the $RE_{1-w}A_wM_xE_y$ phosphor has exclusively an $EuM_2E_4$ pseudoorthorhombic crystal structure.

16. The light emitting device of claim 14, wherein the primary light is blue light.

17. The light emitting device of claim 16, wherein the secondary light has a wavelength between about 475 nanometers and about 560 nanometers.

* * * * *